(12) United States Patent
Hochstenbach

(10) Patent No.: US 8,350,385 B2
(45) Date of Patent: Jan. 8, 2013

(54) REDUCED BOTTOM ROUGHNESS OF STRESS BUFFERING ELEMENT OF A SEMICONDUCTOR COMPONENT

(75) Inventor: Hendrik Hochstenbach, Nijmegen (NL)

(73) Assignee: NXP B.V., Eindhoven (NL)

( * ) Notice: Subject to any disclaimer, the term of this patent is extended or adjusted under 35 U.S.C. 154(b) by 47 days.

(21) Appl. No.: 12/670,562

(22) PCT Filed: Jul. 15, 2008

(86) PCT No.: PCT/IB2008/052840
§ 371 (c)(1),
(2), (4) Date: Jan. 25, 2010

(87) PCT Pub. No.: WO2009/016531
PCT Pub. Date: Feb. 5, 2009

(65) Prior Publication Data
US 2010/0187688 A1    Jul. 29, 2010

(30) Foreign Application Priority Data
Jul. 30, 2007  (EP) .................................. 07113388

(51) Int. Cl.
*H01L 23/485* (2006.01)
(52) U.S. Cl. .............. 257/738; 257/737; 257/E21.59; 257/E23.023; 257/E23.175; 438/613
(58) Field of Classification Search ............... 257/738, 257/737, E21.59, E23.023, E23.175; 438/613
See application file for complete search history.

(56) References Cited

U.S. PATENT DOCUMENTS

| 6,118,180 | A  | 9/2000 | Loo et al. |
| 6,376,911 | B1 | 4/2002 | Ryan |
| 6,548,898 | B2 | 4/2003 | Matsuki et al. |
| 6,667,230 | B2 | 12/2003 | Chen |
| 6,914,332 | B2 | 7/2005 | Zuniga-Ortiz |
| 2003/0013291 | A1 | 1/2003 | Chen |
| 2003/0178644 | A1 | 9/2003 | Lee et al. |

(Continued)

FOREIGN PATENT DOCUMENTS

EP    0 064 854 A1    11/1982

(Continued)

OTHER PUBLICATIONS

Bonda, Rao, et al; "Improved Bonding Pad Design for Fluxless Flip Chip Bonding Process and Low Fracture Strength Substrates"; 2000 Electronic Components and Technology Conference; IEEE; pp. 1701-1704.

(Continued)

*Primary Examiner* — Long Pham

(57) ABSTRACT

The present invention relates to a stress buffering package (49) for a semiconductor component, with a semiconductor substrate (52); an I/O pad (54), electrically connected to the semiconductor substrate (52); a stress buffering element (74) for absorbing stresses, electrically connected to the I/O pad (54); an underbump metallization (70), electrically connected to the stress buffering element (74); a solder ball (60), electrically connected to the underbump metallization (70); a metal element (61) between the solder ball (60) and the semiconductor substrate (52); a passivation layer (56, 58), which protects the semiconductor substrate (52) and the metal element (61) and which at least partially exposes the I/O pad (54); characterized in that a roughness of an interface between the stress buffering element (74) and the passivation layer (56, 58) is lower than a roughness of an interface between the metal element (61) and the passivation layer (56, 58). Furthermore the invention relates a method for manufacturing a stress buffering package (49) for a semiconductor component.

14 Claims, 6 Drawing Sheets

U.S. PATENT DOCUMENTS

2004/0082101 A1    4/2004    Honda

FOREIGN PATENT DOCUMENTS

| | | |
|---|---|---|
| EP | 0875934 A2 | 11/1998 |
| EP | 1333494 A2 | 8/2003 |
| EP | 1365449 A2 | 11/2003 |
| GB | 2135525 A | 8/1984 |
| JP | 1128545 A | 5/1989 |
| JP | 9120963 A | 5/1997 |
| KR | 20020055350 | 7/2002 |
| WO | 2004059708 A2 | 7/2004 |
| WO | 2005/115679 A1 | 12/2005 |
| WO | 2007/085988 A1 | 8/2007 |

OTHER PUBLICATIONS

Xiao, Guowei, et al: "The Effect of CU Stud Structure and Eutectic Solder Electroplating on Intermetallic Growth and Realiability of Flip-Chip Solder Bump"; 2000 Electronic Components and Technology Conference; IEEE; pp. 54-59.

REDUCED BOTTOM ROUGHNESS OF STRESS BUFFERING ELEMENT OF A SEMICONDUCTOR COMPONENT

FIELD OF THE INVENTION

The present invention generally relates to a stress buffered semiconductor component according to the preamble of claim 1. The present invention further relates to a method for making a stress buffered semiconductor component.

BACKGROUND OF THE INVENTION

Mainly, so-termed chip scale packages (CSPs) are concerned here. These are in fact not packages with a separate package carrier and an encapsulation, but semiconductor components with a stress relief structure on top of the passivation layer. A semiconductor substrate, e.g. comprising an electrical element like a diode, a transistor, a MEMS (Micro-Electro-Mechanical Element) or a capacitor, is fixed to a board, such as a printed circuit board (PCB), by means of solder balls without using an additional carrier. A CSP is used inter alia for so-termed power transistors and for electrostatic discharge (ESD) diodes, usually in combination with a passive filter comprising resistors, capacitors and/or coils. CSPs are furthermore used in particular for electric circuits with a limited number of I/Os for applications where size is relevant. An example hereof is an audio circuit for a frequency modulation (FM) radio. This is a semiconductor with an amplifier and a tuner and any circuits that may further be required, which is capable of performing a radio function in a mobile telephone in its entirety. Partially because of the small amount of space that is available in a mobile telephone, the size of the package is of the essence in this case.

Generally, the solder balls of a CSP are mounted directly on a motherboard or PCB provided with electrodes corresponding to the solder balls. The solder balls are soldered onto the board to obtain an electronic device. During said soldering and during use of the device, stresses will occur as a result of the differences in thermal expansion between the material of the board and, for example, the silicon of a semiconductor. Said stresses occur in particular in the solder balls and at the interface of the solder balls and the underlying structure. If no measures are taken, this will lead to an insufficient degree of reliability of the electronic device, in particular during thermal cycling (TMCL) and fall tests. This has led to the provision of stress buffering packages as described in the following paragraphs, in which a stress buffering means for absorbing stresses is provided between the I/O pads and the solder balls.

US patent document US2004/0082101 discusses a CSP that makes use of an insulating stress absorbing resin layer. The associated package 10 is shown in FIG. 1. The stress absorbing resin layer 12, which is made of a thermosetting resin such as epoxy resin or polyimide resin, has a modulus of elasticity of 0.01-8 Gpa and is relatively flexible, therefore. After the resin layer has been coated on the passivation layer 14, holes are etched so as to expose the so-termed I/O pads. Then the holes are filled with a flexible conductive layer 18. The conductive layer comprises a powdery material of at least one of copper, lead, tin, nickel, palladium, silver or gold. Finally, solder balls 20 are placed on the conductive layer 18. The stress absorbing layer 12 and the conductive layer 18 jointly form a stress buffering means 22. The layer 12 is made of an elastic material having a thermal expansion coefficient of 40-600 ppm/K. For all the embodiments that are shown in US2004/0082101 it obtains that the stress buffering means 22 is uninterrupted, at least from a thermomechanical point of view. Because both the stress absorbing layer 12 and the conductive layer 18 are flexible, stress occurring in one of the solder balls can be transmitted to adjacent solder balls via the stress buffering means 22.

The method as discussed in US2004/0082101 comprises a number of difficult and costly steps such as lithography, etching, plasma surface treatments, screen printing, etc. In addition, the conductive layer 18 comprises materials which present problems when manufacturing semiconductors, in particular in the waferfab. The use of materials such as copper or gold may lead to the electronic circuits in the silicon being affected.

Another known solution is presented in FIG. 2, which shows a package 30 in which a stress absorbing layer 32 of polyimide is provided on top of a passivation layer 34. An opening is present in the layer 32, which opening at least partially coincides, seen in projection, with the opening in the passivation layer. An underbump metallization (UBM) 36 is present partially on the stress absorbing layer 32 and partially in the opening (for contact with the I/O pads 40). The UBM thus has the shape of an upside-down cowboy hat. The UBM does not fill the openings in the passivation layer and the buffer layer completely, so that a hollow is formed. As a result, the solder balls 38 are partially present in said hollow. In this solution, too, a stress buffering means comprising the stress absorbing layer 32 and the UBM layers is thermomechanically uninterrupted. The fact of the matter is that the UBM layer is a hard layer, certainly in comparison with the material of the stress absorbing layer and the solder balls, which hard layer generally comprises nickel and which will transmit the stresses that occur to the adjacent UBM structures via the surrounding polyimide layer.

Varying phases of heating and cooling occur during TMCL. This is discussed, for example, in patent documents GB 2,135,525 and EP 0 064 854. It is also known for ball grid array (BGA) packages. It is a generally known fact that the largest problems with TMCL normally occur at the solder balls furthest away from the center of the package (i.e. the center of the semiconductor, also referred to as the neutral point). After all, in TMCL the board expands more than the semiconductor. The left-hand edge of the semiconductor is pulled to the left and the right-hand edge is pulled to the right relative to the center of the semiconductor upon heating, therefore. The difference in movement between the semiconductor and the board is much larger at the edge of the semiconductor than somewhere in the center.

SUMMARY OF THE INVENTION

The object of the present invention is to provide a reliable Chip Scale Package, e.g. a reliable stress-buffered component that is better able to withstand thermal cycling and fall tests.

This object is achieved by providing a package which is characterized in that a roughness of an interface between the stress buffering element and the passivation layer is lower than a roughness of an interface between the upper metal layer and the passivation layer.

The terms "roughness" or "interface roughness" mean in the context of the present application the number of steps in an interface and/or the average steepness or slope of steps in an interface. I.e., the higher the number of steps or the higher the average steepness or slope of steps the higher the roughness of such an interface. Steps in this respect are in particular steps created by metal elements or interconnecting traces on the semiconductor substrate. Steepness or slope of a step means in particular the steepness or slope of the edge or riser of the step.

The present invention comprises the perception that none of the afore-mentioned prior art documents is aware of or discusses the problems when having active elements and/or metal elements, like interconnection traces or dummy metals, under the ball or bump. Stresses on those additional elements are not discussed in the afore-mentioned prior art.

Those additional elements are preferably also to be placed under the ball because of the fact that this makes it possible to reduce the surface area per semiconductor and thus obtain more products from a single wafer or batch. This reduction of the I/O pad, which is not combined with a reduction of the solder ball, provides a reduction of this unusable part of the semiconductor. This can be seen for example in U.S. Pat. No. 6,118,180. This document shows a metal layout on a semiconductor chip to be used in such a flip chip technique. This reference wants to have a flip chip metal layout which is compatible with reduced chip pitches by providing a metal layout on a semiconductor chip which comprises a surface metal bonding pad, a metal region and an UBM under a solder ball. The metal layout is shown in FIG. 3. FIG. 3A shows a cross-sectional view and FIG. 3B shows a corresponding top view. The surface metal I/O pad has reference numeral 402. The Figures show an interconnecting trace 404 and dummy metal elements 430. The UBM has reference numeral 408. On top of the UBM 408, a solder bump 412 is present.

As can particularly be seen in FIG. 3A the interconnecting trace 404 and dummy metal elements 430 are defined adjacent to said bonding pad 402 and spaced between about 1.0 and 3.0 µm from said bonding pad 402. The UBM 408 and even more the ball 412 overly said surface metal pad 402 and also at least portions of said adjacent metal elements 404, 430. But this document is silent about the stresses which are induced in the structure when TMCL or drop tests are applied. There is no stress buffer below the UBM 408 in this document which stress buffer could absorb said stresses which occur in the solder ball and at the interface of the solder ball and the underlying structure during TMCL or during a drop test.

Although this prior art uses dummy metals 430 under the ball to make the surface of the passivation layer more flat, this prior art is not aware of or discusses the problems when having such dummy metals under the ball. The negative impact of stresses caused by the dummy metals 430 and by the interconnecting trace 404 or of any other possible additional elements under the ball are not at all discussed in this prior art. Accordingly no solutions to this problem are discussed or proposed in the prior art.

The present invention provides a planarized upper passivation surface and therefore the present invention avoids cracks in the passivation layer due to brittleness and possible delamination due to stresses caused by a structure of a combination of the upper metal layer of the interconnect structure. Such stresses are particularly relevant for electric circuit in which the interconnection structure comprises a dielectric layer with a relatively low dielectric constant. Such layers, which are known per se as low-K material and of which SiLK™ and benzocyclobuteen (BCB) are examples, are often polymeric in nature and have a relatively weak adhesion which the metal layers in the interconnect structure. Due to the high vulnerability of a CSP package in comparison to a conventional packaged semiconductor component, this turns out to be a reliability concern. More particularly, the invention has been generated in the course of designing CSP-packages for electric circuits in a process known as C65. This is a CMOS process in which the channel length of the smallest and characteristic transistors is 65 nm. Such small transistors lead to a large density thereof, and an interconnect structure with often many metal layers. Since the lower of those metal layers have a high resolution and due to the use of low-K materials or even airgaps, the overall metallisation structure is mechanically weak.

The passivation layer generally includes a first portion defined on top of an element in the upper metal layer, usually an interconnect, inductor or other element. It will further include a second portion adjacent to such an element. If the planarisation layer is not planarized, upper surface of its first and second portions will include an angle. According to the invention, this angle is suitably less than 50 degrees. In this manner forces and stresses in a lateral direction can be released. If the angle is larger, and thus effectively, the passivation layer, such forces in lateral direction will be transferred also to such elements in the upper metal layer. Such this upper metal layer is part of the interconnect structure, there is then a large risk that stress is released through the interconnect structure, that is mechanically weak and gives a large chance on cracks.

The present invention solves the problems of the prior art with limited board level reliability (BLR) during TMCL and drop tests. This also overcomes the problem that the limited BLR of the prior art also had reduced the maximum array size one can possibly use, seeing that with larger bump arrays the reliability decreases. Without the special precautions of the present invention mainly the solder balls will absorb the difference in thermal expansion between the PCB and the semiconductor of the substrate. In the prior art the limited BLR had limited the possible maximum array size of wafer level packaging (WLP) to an array size of 7×7 with 0.5 mm bump pitch. This limited the application of WLP to analog devices, integrated discretes and FM radio devices. Due to the present invention it is now possible to make WLP available for passive integration devices and for digital signal processing (DSP) devices.

Another perception of embodiments of the present invention is that the degree of reliability can be enhanced by splitting up a stress buffering element into smaller individual elements, in particular by providing a separate stress buffering element for each solder ball. Each stress buffering element absorbs at least a significant part of the stresses that are set up in the solder balls and in the underlying structures as a result of the differences in thermal expansion between the electrical element and an associated board, preventing premature fracturing and dysfunctioning of the electronic connections in the package.

Even more improved reliability can preferably be obtained if the stress buffering elements are not connected, which is effected by providing the passivation layer. This means, among other things, that preferably the upper side and the sides, at least part of the sides, of the stress buffering elements do not have an interface with the passivation layer in such an embodiment.

The separate (from a thermomechanical point of view) stress buffering elements provide at least two additional mechanisms for stress relaxation and deformation that the prior art does not provide.

As already noted before, the difference in movement between the semiconductor and a board is larger at the edge of the semiconductor than somewhere in the center. The amount of stress in one solder ball is greater than in another solder ball, therefore. When the stress buffering means is not split up and is thermomechanically uninterrupted, it is conceivable that stresses generated by one solder ball are transmitted to an adjacent solder ball, in which case the stresses may accumulate at an unpredictable location, such that cracks are locally formed. This may take place at the interface between a solder ball and an associated connecting structure, for example. The stresses that occur in adjacent solder balls may be transmitted to a solder ball positioned therebetween, for example, in such a way that said stresses will intensify each other. Solutions with split stress buffers according to embodiments of the present invention prevent the occurrence of such a concentration of stresses.

The combination of a stress buffering element and a solder ball may be regarded as two series-connected springs. Said springs are capable of adjusting themselves optimally in dependence on the specific thermal cycling situation, thus providing a second advantageous mechanism. Said adjustment may differ with every connection from substrate to semiconductor, i.e. for every combination of a solder ball and a stress buffering element.

The fact that the stress buffering elements are preferably thermomechanically independent of adjacent stress buffering elements in itself renders the solution according to such embodiments of the present invention different from the prior art.

Suitably, the stress buffering element on top of the I/O pad and below the UBM is an Al layer, a Cu layer or an alloy largely based on Al or Cu. More preferably, it has a thickness of at least 0.5 microns and more preferably of at least 1.0 microns. The use of Al or Cu is compatible with the manufacture of the interconnect structure. Moreover, the use of such layer with a substantial thickness allows that each I/O pad may absorb stresses, not only in a direction perpendicular to the semiconductor substrate, but also in lateral directions.

An additional advantage of applying an Al layer is that the UBM which is normally NiAu can be applied with an electroless deposition process, which saves a mask step. The mask step is by far the most expensive step of the packaging process.

A further aspect is the fact that the structure according to the embodiment of the present invention with independent buffer elements does not appear to be suitable for use in combination with redistribution in the stress buffering means. Such a redistribution track would provide more connection to the passivation layer and, combined with a connection to the substrate, would thus lead to failure of the connection between the redistribution track and a bump pad accommodating a solder ball.

As already indicated, in some embodiments of the present invention it is advantageous if an individual and thermomechanically separate stress buffering element be provided for each I/O pad. It is not excluded, however, to use one stress buffering element for a group comprising several solder balls arranged adjacently to each other, or to interconnect the stress buffering elements for a number of solder balls by means of a further connection layer. This obtains in particular for the solder balls located near the center line of the semiconductor. This connection and fixation of a number of thermomechanically fairly uncomplicated solder balls moreover appears to make it possible to carry out a redistribution anyway.

Preferably, stress buffering elements of an electrically conductive material are used, in which in fact the function of electrically connecting the solder balls to the I/O pads is combined with the function of absorbing the stresses that occur. Since the stress buffering elements are individual, patterned elements, this does not present any short-circuiting problems.

The stress buffering means and the solder ball are preferably selected so that they have a comparable elasticity, plasticity and thermal expansion coefficient. For the Young's modulus it is advantageous if both have a modulus of 10-100 GPa, more advantageously 20-80 GPa and even more advantageously 25-75 GPa. A similar effect obtains for the plasticity value: an advantageous value for both is a plasticity limit of 20-250 MPa, it is even more advantageous if this range of values is less wide. Good results have been achieved with a combination of stress buffering elements of an aluminium alloy (E-modulus 60 GPA, plasticity limit 200 MPa) and so-termed SAC solder (tin-silver-copper solder having an E-modulus of 32 GPa and a plasticity limit of 20 MPa), which both have a thermal expansion coefficient of 20-25 ppm/K.

The stress buffering elements are preferably coated with a bonding material for solder, such as nickel—this bonding material also referred to as the Underbump metallisation. Preferably, the nickel has a sufficient thickness, especially in combination with the use of a high-tin solder, such as SAC. The fact is that this solder tends to slowly dissolve the Ni. Once the Ni layer has been completely consumed, the solder ball will no longer bond and the life of the connection has come to an end. Advantageous results have been achieved with Ni-layers having a thickness of at least 0.4 μm, more preferably 0.8 μm and even more preferably even thicker. It is noted in this connection that both the stiffness and the elasticity limit of Nickel is much higher than that of aluminium (alloys) and solder. Nickle, for example, has an E-modulus of 161 GPa.

Said Ni-layers are usually doped with a retarding agent, which prevents Nickel from dissolving. It is possible to use 8% Vanadium in the Ni for this purpose. Preferably, 5-10% phosphorous is added in the case of NiAu electrodes. The required thickness of the layer of bonding material depends on the diameter of the solder ball and the specific type of folder, of course, and also on the conditions to which an electronic device is exposed during use.

It is very advantageous to apply the bonding layer in such a manner that it is present not only on the upper side but also on the sides of each stress buffering element, at least on that part of the side that does not have an interface with the underlying passivation layer. The visible result is that the solder can also extend on said side. Probably this leads to a different angle of contact between the solder and the underlying surface than in the case in which the bonding layer is only present on the upper side of a stress buffering element. Such a different, probably more advantageous angle of contact may have a positive effect on the deformation of the solder ball in a lateral direction, i.e. parallel to the substrate.

It will be understood, however, that coating the entire stress buffering element with bonding material also leads to an increased resistance of the element against corrosion. Corrosion problems frequently occur in particular with Al. The seal obtained with the bonding material (and also with the solder, therefore) provides an excellent resistance against moisture and all kinds of other environmental factors to which a surface is exposed during further assembly, for example during the cleaning steps, and during use.

An advantageous manner of applying the bonding material, e.g. the UBM, both to the upper side and to the sides of the stress buffer element is by means of an electroless plating technique, as known per se to those skilled in the art. On the other hand, when a sputtering technique is used for applying the Ni, the Ni is only applied to the upper side of the stress buffering elements.

It has become apparent that when aluminium stress buffering elements are used, a minimum and a maximum thickness are to be maintained. When the Al-layer is too thick, the buffering layer will be too soft and will tear. When the Al-layer is too thin, the layer will be too stiff and will likewise tear. A suitable range is a thickness of 1-5 μm. For the sake of clarity it is mentioned that the term "thickness" as used herein is understood to refer to the thickness of the parts of the stress buffering elements that extend from the upper side of the passivation layer. It will be apparent to those skilled in the art that said minimum and maximum values depend on the material that is used. Alloys of Al, such as Al—Mg, are generally stiffer, for example, and require much greater thicknesses. It is not excluded that the stress buffering elements comprise several sublayers, possibly of different materials.

In view of the relation between the required expansion or deformation and the distance to the center line of the semiconductor, and consequently also between the stress load and the distance to the center line of the semiconductor, the enhanced reliability can be enhanced even further by having the stiffness of a stress buffering element decrease as the distance to the center line of the semiconductor decreases. This so-termed on-chip variation can only be used within bounds, of course. Such a variant may provide a solution for chip size packages having a larger matrix than that of 7*7 and/or larger semiconductor surfaces.

As already indicated before, redistribution is not always possible when using electrically conductive and thermomechanically separate stress buffering elements. Apart from the embodiment that has been explained in the foregoing, there is another possibility which is in fact even simpler: it is possible to use a stress buffering element for redistribution if said stress buffering element is not mechanically connected to the opposite substrate or board. This means that the ends of such a redistribution part must be led back to the metallization under the passivation layer via openings therein.

In addition to its use for redistribution (interconnection), this possibility is also very suitable for definition of, for example, coils in such a stress buffering element. The thickness of the Al renders this layer very suitable for this purpose.

For the sake of completeness it is furthermore noted that the use of an UBM of nickel results in a mechanically hard plate between the solder ball and the stress buffering element. It is assumed that the solution according to such embodiments of the present invention will also function on the basis of a series-connected spring system (in which case the spring near the semiconductor is capable of deformation, therefore) without such a hard plate.

In particular it is noted that from WO2005/115679 a solder material is known which is capable of bonding to Al without a separate bonding layer being used. This material can be used to advantage in combination with the present invention, of course. Its use may also be advantageous if a bonding layer is used anyway, viz. to provide additional protection.

An important advantage of the CSP-package according to the invention is that the I/O pads under the passivation layer can have a small diameter without the diameter of the solder balls being reduced proportionally. This will be explained in more detail in the description of the figures. Compared to the prior art solution, as shown in FIG. 2, a reduction from 120*120 μm to 10*10 μm for every I/O pad seems possible. This is a reduction by a factor of more than ten, therefore.

This reduction moreover makes it possible to reduce the surface area per semiconductor and thus obtain more products from a single wafer or batch. Furthermore, the reduction makes it possible to define an active element and/or metal element, like an interconnection or a dummy metal, under the solder balls in a CSP. The large I/O pads as used in the prior art according to the embodiment of FIG. 2, which were necessary in particular because of the weak bond of the polyimide, led to mechanical stresses that could not be combined with an active element and/or a metal element present thereunder. The reduction of the I/O pad, which is not combined with a reduction of the solder ball, provides a advantageous reduction of this unusable part of the semiconductor. Consequently this solution is very suitable and predestined for use in mobile telephony and other portable products.

It is noted that also the diameter of the I/O pad according to the invention will be smaller than that of the I/O pads shown in FIG. 1 of US2004/0082101. To obtain a suitable low resistance of the connection between board and semiconductor by means of the conductive layer 18, the diameter in the opening through the passivation layer will have to be reasonably large. The fact is that the conductive powder will probably be provided in a flexible, non-conductive material so as to obtain the desired flexibility, which increases the overall electrical resistance of the layer 18. The overall electrical resistance will thus be lower than, for example, the electrical resistance of a stress buffering element according to the invention, which comprises aluminium.

The basic idea of the present invention is to provide a simpler package construction usable with standard wafer fabrication materials and technologies, in which construction the stress buffer is preferably an aluminum layer on top of a planarised wafer surface by using a first passivation layer serving as a planarization layer. The first passivation layer is preferably made of $SiO_2$ which is preferably planarized by spin-on-glass (SOG) and subsequent chemical mechanical polishing (CMP). This type of planarisation has the advantage of placing the bumps on active area that saves silicon. The UBM on top of the stress buffer is preferably an electroless NiAu layer. The solder ball is placed simply on top of the UBM.

BRIEF DESCRIPTION OF THE DRAWINGS

The invention will be explained in more detail hereinafter with reference to the appended figures, in which.

DETAILED DESCRIPTION OF THE INVENTION

Figure 1:
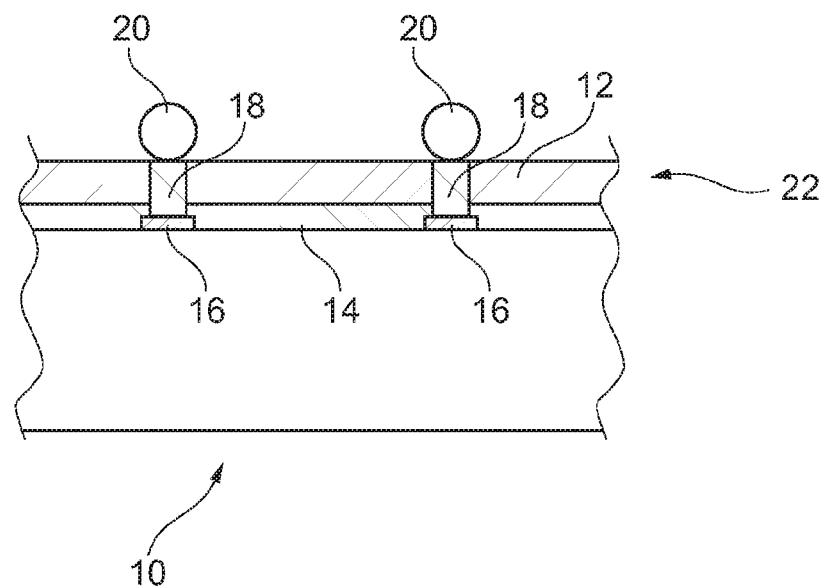
FIGS. 1, 2, 3A and 3B are drawings of known devices of the afore-mentioned prior art.

The components in the drawings are not necessarily to scale, emphasize instead being placed upon clearly illustrating the principles of the present invention. Features that are substantially or functionally equal or similar will be referred to with the same reference sign(s).

FIGS. 1, 2, 3A and 3B are drawings of devices of the prior art, which has been discussed in the foregoing.

Figure 4:
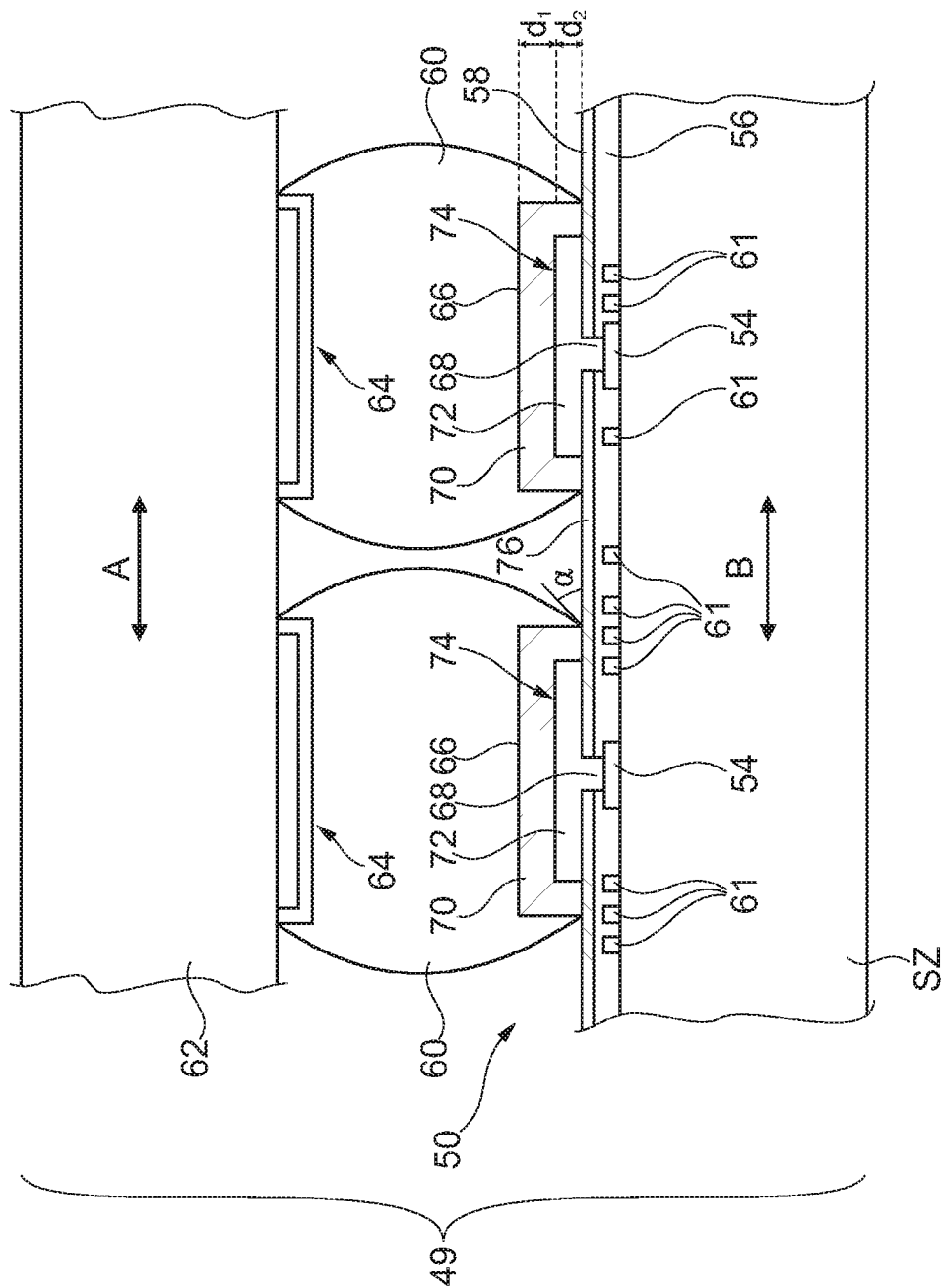
FIG. 4 is a schematic view of a part of a section of a CSP package according to a preferred embodiment.

FIG. 4 shows a stress-buffered semiconductor component or Chip Scale Package (CSP) 49 comprising an interconnect structure 50 on a semiconductor substrate 52. This interconnect structure 50 comprising one or more metal layers. A number of I/O pads 54 is defined in an upper one 61 of the metal layers of the interconnect structure 50. A first passivation layer 56 is provided on top of this upper metal layer 61. This first passivation layer protects the active regions of the structure 50 and exposes the I/O pads 54. The first passivation layer 56 preferably comprises $SiO_2$. Usually an additional second passivation layer 58 of silicon nitride is applied on top of the first passivation layer 56. The second passivation layer 58 should preferably be thicker than 400 nm to avoid pinholes.

Figure 5:
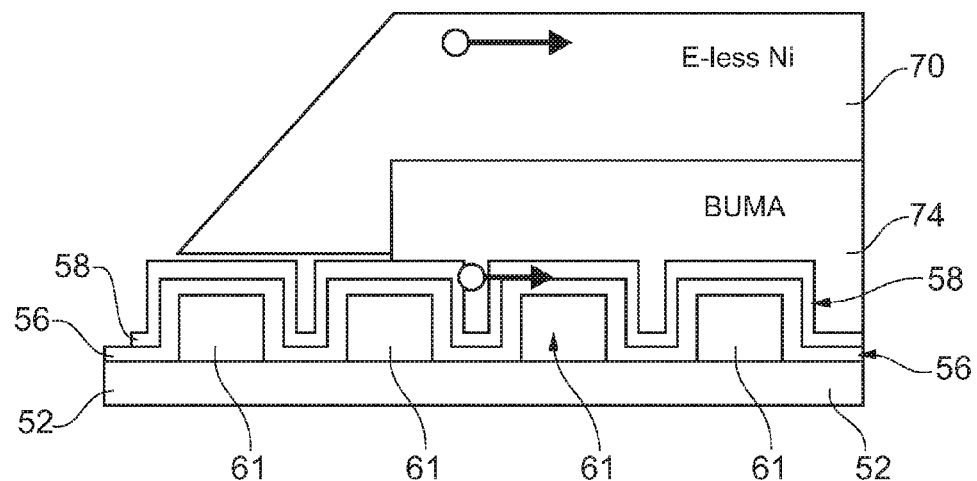
FIGS. 5 and 6 are a schematic drawing and a picture showing an interface between the stress buffer layer and the second passivation layer without planarization of the first passivation layer.
Figure 6:
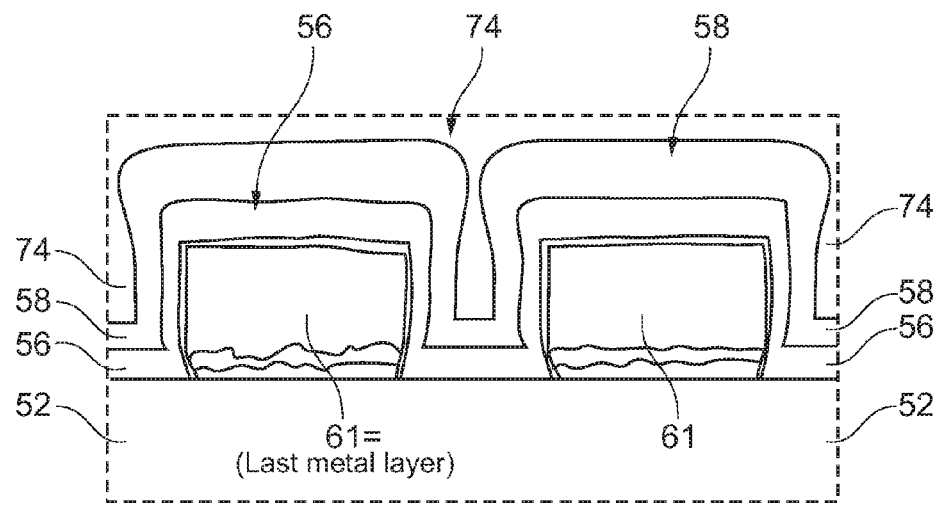

The first passivation layer 56 protects elements in the upper metal layer 61 which are part of the interconnect structure. The structures or layers 61 have an irregular top side as shown in FIGS. 5 and 6. This irregular top side is normal practice in integrated circuits (ICs) with an interconnect structure 50 with many metal layers. Particularly for a wirebonded chip—which is overmoulded with a moulding compound, e.g. glass-epoxy material,—the irregular top side is advantageous: it leads to a better adhesion between moulding compound and chip. It is thus part of the present invention that such irregular top side is not advantageous for CSPs. The interconnect structure 61 in such advanced ICs is normally made with copper and a process known as dual damascene.

Solder balls 60 function to electrically connect the structure 50 or another electrical element to a board 62, which is to that end provided with electrodes 64. The I/O pads 54 and the solder balls 60 are electrically connected by an UBM 70 and a stress buffering element 74. An outer upper and side-facing surface of the UBM 70 forms a so-termed bond pad 66, which makes it possible to place the solder ball 60 on the UBM 70.

Each stress buffering element 74 is built up of a first part 68, which is provided in an opening in the passivation layers 56 and 58, and a second part 72, which extends from the surface 76 of the second passivation layer 58. The first part 68 makes contact with the I/O pad 54 in question, whilst the second part 72 is electrically connected to the solder ball 60 in question via the UBM 70. The dimensions of the first part 68 in directions parallel to the surface 76 are much smaller than the dimensions in the corresponding directions of the second part 72. This is clearly shown in FIG. 4. A major advantage of this aspect is that it is possible to use relatively small I/O pads 54, at least without there being a need to adapt the diameter of the solder ball 60. This phenomenon is also referred to as repassivation. It is advantageous in particular because the region under the I/O pads 54 cannot normally be used for active circuits or interconnect structures because of the stresses to which the I/O pad 54 are exposed. When the dimensions of the I/O are reduced, as it is the case in the embodiment of FIG. 4, a larger part of the semiconductor substrate 52 an be effectively utilised.

Preferably, each stress buffering element 74 is built up of only one material or one component. It is conceivable, however, for the two parts 68 and 72 to consist of several layers, each layer being geared to the specific properties that are required.

The solder balls 60 form a conductive connection to electrodes 64 of a PCB 62 so as to form an electronic device therewith.

It is a well-known fact that the coefficient of thermal expansion of the silicon of the semiconductor 52 is much lower than the coefficient of thermal expansion of the materials that are used for the PCB. This leads to stresses in the package 49 during testing and during further use. In view of the dimensions of the two components, it is especially differences in expansion in the devices A and B shown in FIG. 4 that are relevant in this connection. Furthermore it will be apparent that the difference in expansion will be larger in the solder balls 60 provided at the edge of the semiconductor substrate 52 than in the solder balls 60 that are located in the center of the semiconductor substrate 52. The problem of thermal stresses plays a much smaller part in the case of the latter solder balls 60, therefore.

According to the shown embodiment of the present invention, the aforesaid stresses are neutralized by the stress buffering element 74. The larger portion of the stresses will be absorbed by the parts 72 of the stress buffer 74. This means that the stresses in one connecting structure/solder ball 60 will not be transmitted to adjacent connecting structures/solder balls 60. This in contrast to the stress buffering means 22 of FIG. 1 and the stress buffering means 36, 32 of FIG. 2. The connecting structures 18 (FIG. 1) and 36 (FIG. 1), on the other hand, will be able to transmit stresses in this case. The shown embodiment of the present invention thus provides a number of significant advantages, as already described before.

As already noted before, the configuration that is shown in FIG. 4 could be modelled as a set of series-connected springs, with the differences in thermal expansion determining the stretch of the springs and the material and the thickness of a layer determining the spring characteristic. In FIG. 4, for example, a relatively stiff spring corresponding to the UBM 70 is in that case connected to two relatively soft springs, which correspond to the stress buffering part 74 of aluminium and the solder balls 60, respectively. Each figure shows only two such spring assemblies, therefore, but it will be apparent that in practice (where a multitude of solder balls are used) a multitude of spring assemblies will be provided side by side in two directions. In the shown embodiment of the present invention the stretch and the tensions of the springs in one spring assembly do not influence the stretch and the tensions in the other spring system. In the situation that is shown in FIGS. 1 and 2, a relatively large amount of stretch and tension in one of the springs of the spring assembly can contribute to an increased stretch and tension in adjacent spring assemblies.

Figure 2:
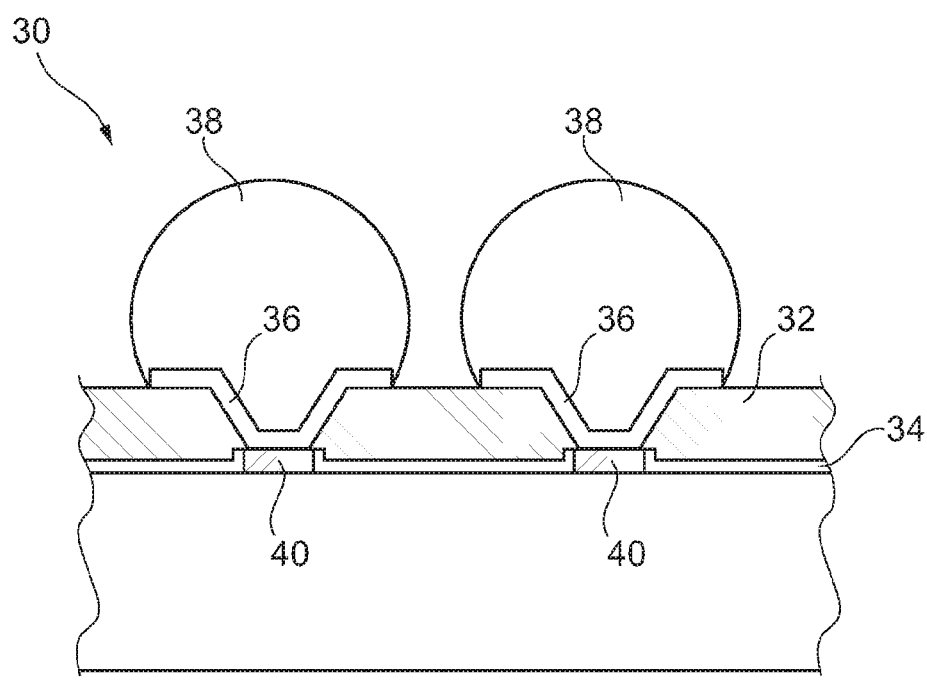
Figure 3A:
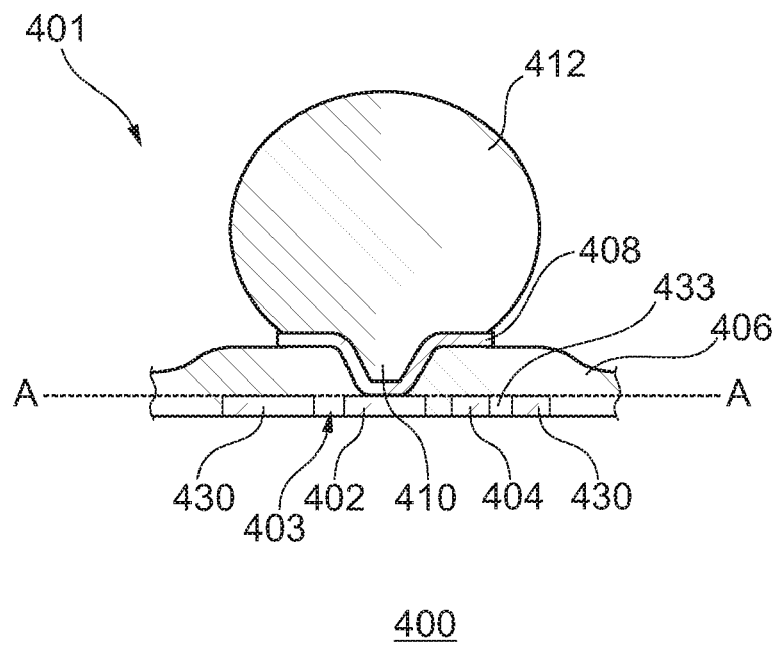
Figure 3B:
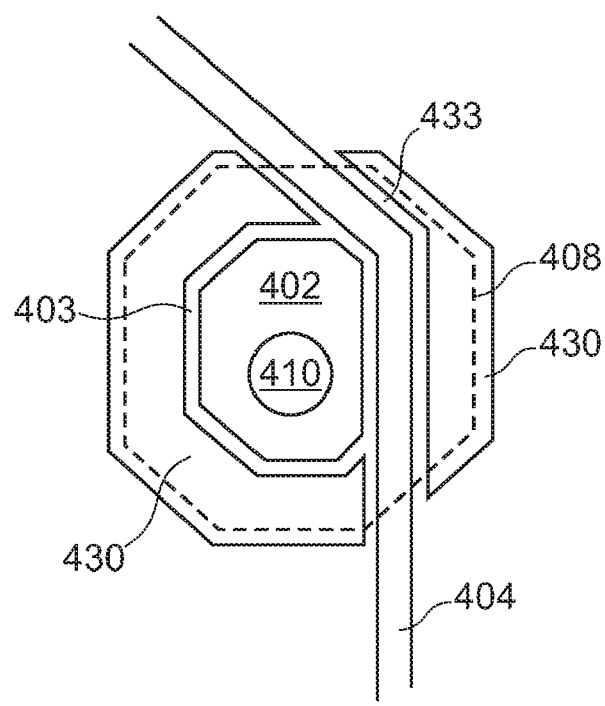

With regard to the known solution as shown in FIG. 2, it is noted that in view of the fact that the UBM 36 is fixed to the bond pad 40 and to the passivation layer 34 only partially determines the deformation and the relative movement of the UBM 36 with respect to the semiconductor by the relative deformation of the stress buffering layer 32. After all, the UBM 36 is fixed to the semiconductor via the I/O pads, and as a result the relative movement and/or the deformation of the hat shape of the UBM 36 is reduced.

The UBM 70 is preferably nickel and has a thickness $d_1$ in the range of 0.15-5 μm. The nickel is preferably applied by means of an electroless plating process. As a result, also the sides of the part 72 of the stress buffer 74 are coated. This is advantageous both with regard to the protection against corrosion of the stress buffer 74 and with regard to obtaining an advantageous angle of contact a of the solder balls 60.

Each stress buffering element 74 preferably consists of an aluminium alloy. Experiments have shown that good results can be obtained by using an aluminium alloy comprising 0.5% copper and a thickness $d_2$ of the part 72 of the stress buffer 74 of 2.5 μm. Preferably, said thickness $d_2$ ranges between 1 and 5 μm.

Preferably, a separate stress buffering element 74 is used for each solder ball 60, in which case stresses in one solder ball 60 or in the underlying connecting structures 61 are not transmitted to adjacent solder balls 60 and stress buffering elements 74. As already indicated, it is conceivable, however, to use stress buffering elements 74 that are thermomechanically interconnected for a group of adjacent solder balls 60, for example by connecting a number of adjacent stress buffering elements 74 via a connection layer provided therebetween (not shown in FIG. 4). In view of the locally lower thermal stresses, this system could be used in particular for the solder balls 60 that are present near the center line of the semiconductor substrate 52.

Another preference is the fact that the stress buffering elements 74 function best on a second passivation layer 58 having a smooth or flattened or planarized surface. If this is not the case, dangerous stress concentrations may build up in the interface between the part 72 of a stress buffering element 74 and the second passivation layer 58 and also between the underlying connecting structures 61 and the first passivation layer 56, each of which may lead to cracks. Since the second passivation layer follows any indentation or roughness of the first passivation layer 56 it is preferred that the first passivation layer 56 is deposited or treated to have a smooth or flattened or planarized surface facing the second passivation layer 58. To provide such an upper surface for the first passivation layer 56 it is preferred to use at least one of the following processes when depositing the first passivation layer 56 using as the main material $SiO_2$: deposition of tetraethylorthosilicate, deposition by HDP, deposition by SOG. It is also possible to limit parasitic capacitance by using a deposition of a material having a lower dielectric constant than $SiO_2$. To further lower the roughness of the surface of the first passivation layer 56 CMP techniques are used to treat the first passivation layer 56 in order to obtain a smooth upper surface of the first passivation layer 56. The result is that a roughness of an interface between the stress buffering element 74 and the second passivation layer 58 is lower than a roughness of an interface between the metal element 61 and the first passivation layer 56.

FIGS. 5 and 6 are a schematic drawing and a picture showing an interface between the stress buffer layer and the second passivation layer without planarization of the first passivation layer.

Figure 7:
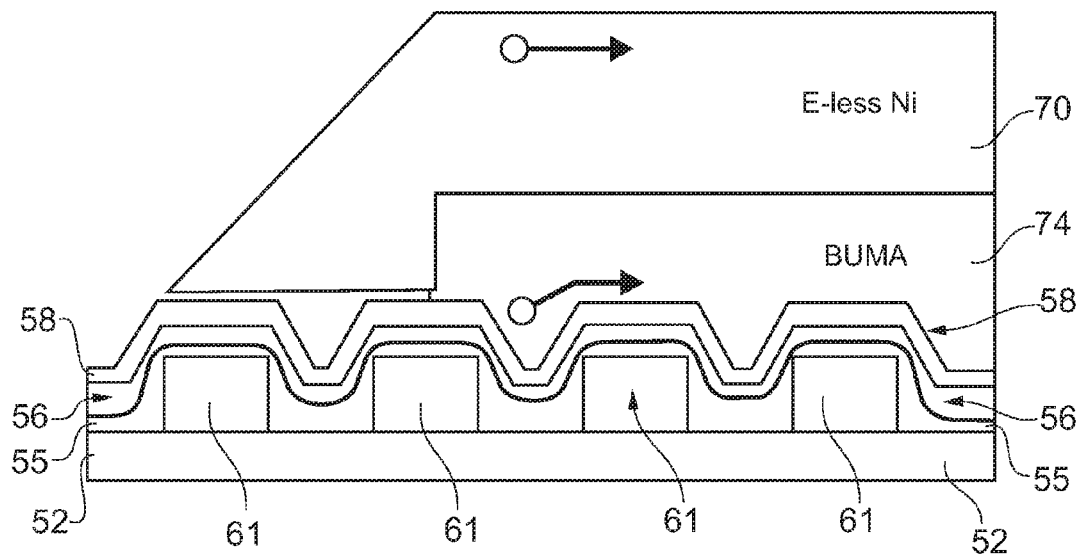
FIG. 7-9 are schematic drawings and pictures showing an interface between the stress buffer layer and the second passivation layer with planarization of the first passivation layer of other preferred embodiments of packages according to the present invention.
Figure 8:
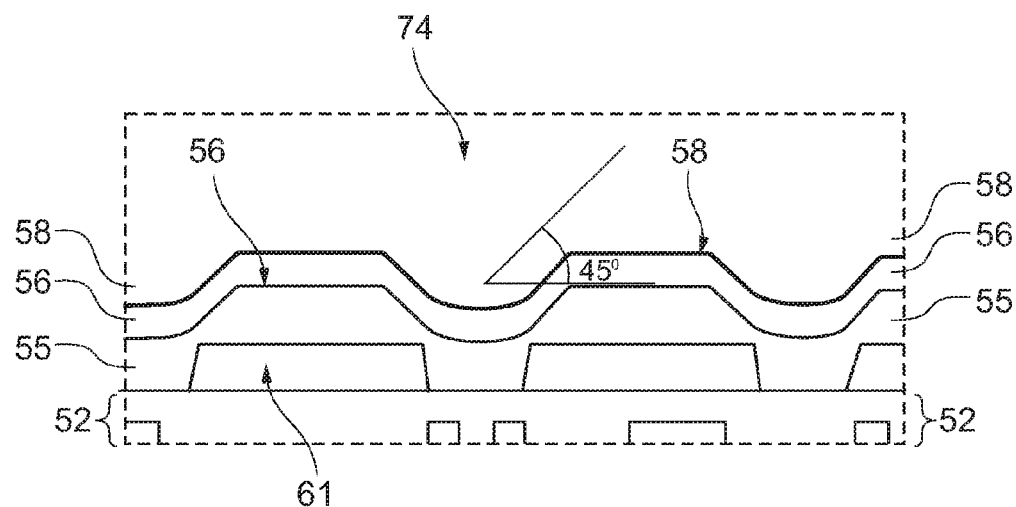
Figure 9:
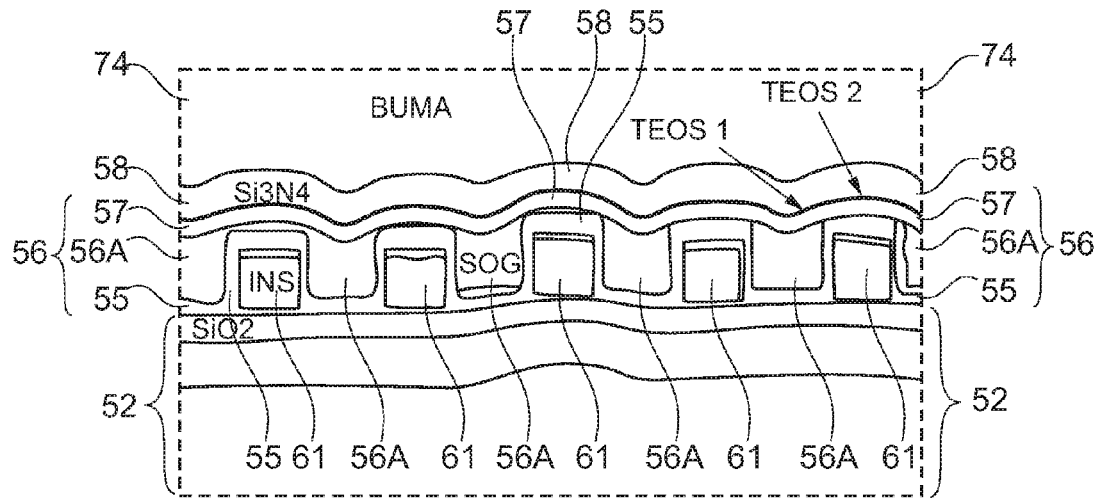
Figure 10:
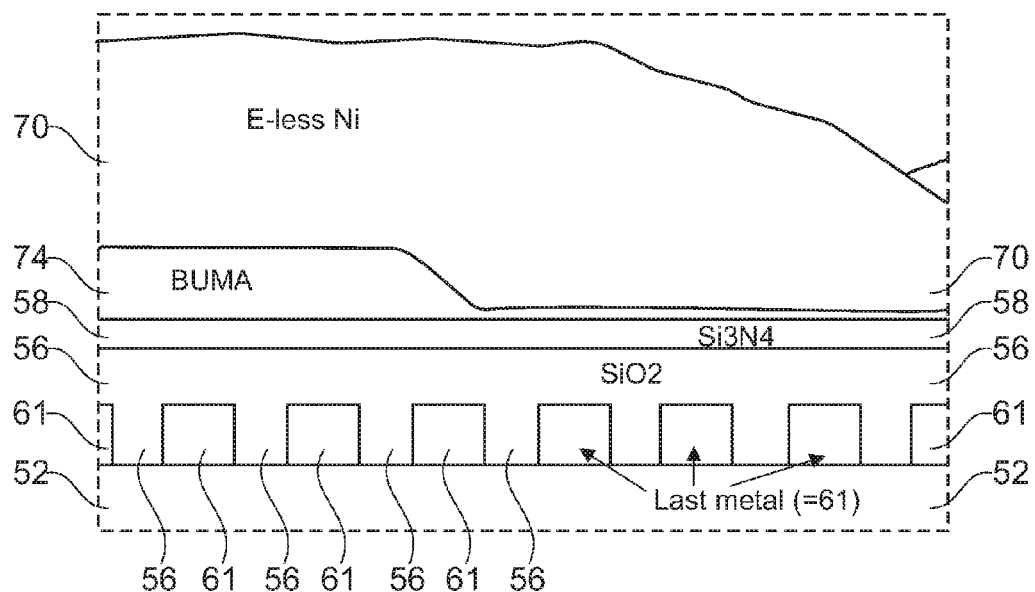
FIG. 10 is a picture of a similar detail of the package of the embodiment of FIG. 4.

FIG. 7-9 are schematic drawings and pictures showing an interface between the stress buffer layer and the second passivation layer with planarization of the first passivation layer of other preferred embodiments of packages according to the present invention; and FIG. 10 is a picture of a similar detail of the CSP-package of the embodiment of FIG. 4. The details of a preferred embodiment of the inventive method are also described with the aid of FIG. 5-10, as follows:

A stress buffer layer 74, also called BUMp on Active (BUMA) layer, will be deposited on top of an IC processed wafer 52. The surface of that wafer 52 shall be planarized in a certain degree, to avoid cracks in the passivation layers 56 and 58. The layer stack below the BUMA layer 74 can be planarized in portions of two-layers, i.e., planarisation steps are carried out during manufacture. The BUMA layer 74 is aluminum but may be made in copper, or in an alloy such as aluminum-copper.

The surface roughness mainly is caused by the structure in the last metal layers 54 and 61 and the way of deposition or treatment of the isolation layer 56 of $SiO_2$.

When the wafer 52 is not planarized the BUMA layer 74 on top will give the impacts on the bumps 60 during TMCL and drop partly to the surface of the wafer 52, as indicated in FIG. 5 by the arrow. Due to the damping effect of the BUMA layer 74, the impact will not be transferred to the surface of the wafer 52 1 by 1, but still there is enough force to crack the passivation layers 56 of $SiO_2$ and 58 of $Si_3N_4$ underneath the BUMA layer 74. And with such a cracking also the top metallisation will be damaged. FIG. 6. shows a x-section of such a package. It does show a bad surface of the second passivation layer 58 of $Si_3N_4$ to deposit the BUMA layer 74. It will also be difficult to deposit the BUMA layer 74 between the Al piles of the last metal layers of the interconnecting traces 61.

To avoid surface roughness, the $SiO_2$ isolation layer, i.e., the first passivation layer 56, on top of the last metal layers of the I/O pad 54 and of the interconnecting traces 61 can be deposited and treated according to the present invention in different ways, e.g. by deposition of $SiO_2$ using HDP, by deposition of $SiO_2$ using SOG, or by deposition of $SiO_2$ using plasma TEOS and then planarising by CMP.

The first passivation layer 56, i.e., the silicon oxide layer 56, that needs a minimum degree of planarisation will be covered with the second passivation layer 58 of silicon nitride. This layer 58 should preferably be thicker than 400 nm to better avoid pinholes. The nitride layer 58 is very strong and can withstand a lot of force during mechanical loading in board level tests.

A degree of planarisation will be achieved in the case of HDP deposition of the $SiO_2$ layer 56 on top of a plasma oxid (PLOX) layer 55 which is deposited on top of the last metals 54 and 61. A schematic drawing and an x-section can be seen in pictures 7 and 8. Accordingly, FIGS. 7 and 8 show a certain degree of planarisation achieved by HDP. The surface of the second passivation layer 58 is not yet flat, but the impact forces will follow the passivation surface of the second passivation layer 58 in a certain degree. This is indicated by the arrows in FIG. 7. The slope of the passivation surface should preferably be about 45 degrees.

Another way of planarisation is SOG, where the space between the last metal layers 61, in FIG. 9 indicated as INS 61 (INS=second interconnect), is filled up with $SiO_2$ by SOG. FIG. 9 shows an x-section of a planarisation with the help of SOG. According to FIG. 9 in this method of planarisation the last metal layers 61 are first covered with a first PLOX layer 55. This first PLOX layer 55 can have contact to the top surface of the wafer 52 which surface can be $SiO_2$. As can be seen in FIG. 9 the first PLOX layer 55 has nearly the same roughness as the structure created by the last metal layers 61 on the $SiO_2$ surface on the wafer 52. In a second step the gaps between the PLOX-covered last metal layers 61 is filled up with a 56A of $SiO_2$ by SOG. The layer 56A of $SiO_2$ is indicated in FIG. 9 by a darker color. This measure of filling up the gaps makes a relatively smooth overall surface with little roughness. This surface is then covered with a second PLOX layer 57 which is accordingly smooth as can be seen in FIG. 9. The first PLOX layer 55, the $SiO_2$-layer 56A and the second PLOX layer 57 build up a first passivation layer 56. On top of the latter layer 57 of the first passivation layer 56 a second passivation layer 58 of $Si_3N_4$ is then deposited as can be seen in FIG. 9. The second passivation layer 58 provides a nicely smooth fundament for the BUMA layer 74 as can be seen in FIG. 9.

The best way to planarise the wafer surface and in particular the first passivation layer 56 is with CMP, where the $SiO_2$ layer 56 above the last metal layer 61 is completely flattened as can be seen in FIG. 10 which shows an x-section of planarisation of the first passivation layer 56 with CMP. In the case of planarisation with CMP the impact forces induced by drop and TMCL can easily follow the flat surface of the second passivation layer 58.

Although solder balls are used in the illustrated embodiments for electrically connecting the package, it is also possible to use stress buffering elements according to the invention in packages that do not comprise solder balls, for example in more conventional packages comprising wire connections to a leadframe. The advantage of this is that the processes used for providing a stress buffering means can be used for several kinds of packages within a factory.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

Any reference signs in the claims should not be construed as limiting the scope.

The invention claimed is:

1. A stress buffered semiconductor component, comprising:
    an electric circuit comprising a plurality of devices defined in a semiconductor substrate and an interconnection structure defined in one or more metal layers on the semiconductor substrate and protected by a passivation layer on top of the upper of the one or more metal layers, which passivation layer partially exposes an I/O pad being electrically connected to the electric circuit;
    a stress buffering element adapted for absorbing stresses on the I/O pad;
    an underbump metallization, electrically connected to the stress buffering element;
    characterized in that a roughness of an interface between the stress buffering element and the passivation layer is lower than a roughness of an interface between the upper metal layer and the passivation layer.

2. A component as claimed in claim 1, characterized in that an upper side of the passivation layer facing away from the upper metal layer is more flat than a lower side of the passivation layer facing towards the upper metal layer.

3. A stress buffered semiconductor component, comprising:
    an electric circuit comprising a plurality of devices defined in a semiconductor substrate and an interconnection structure defined in one or more metal layers on the semiconductor substrate and protected by a passivation layer on top of the upper of the one or more metal layers, which passivation layer partially exposes an I/O pad being electrically connected to the electric circuit;
    a stress buffering element adapted for absorbing stresses on the I/O pad;
    an underbump metallization, electrically connected to the stress buffering element;
    characterized in that a roughness of an interface between the stress buffering element and the passivation layer is lower than a roughness of an interface between the upper metal layer and the passivation layer, and in that the passivation layer comprises a first layer in contact with the upper metal layer and a second layer that extends from the upper side of the first layer.

4. A component as claimed in claim 3, characterized in that the first layer serves as a roughness-lowering or planarization layer for lowering the roughness of the interface between the stress buffering element and the passivation layer.

5. A component as claimed in claim 1, wherein the number of I/O pads exceeds an array of 7×7.

6. A component as claimed in claim 1, wherein the electric circuit comprises a digital signal processor (DSP).

7. A component as claimed in claim 1, wherein the interconnection structure further comprises dielectric layers of a low-K material.

8. A component as claimed in claim 1, wherein at least one of the devices is a transistor with a channel length of at most 65 nm.

9. A component as claimed in claim 1 which is provided with a solder ball on the underbump metallisation.

10. A semiconductor component as claimed in claim 1, wherein the electric circuit is an audio circuit and preferably comprising a circuit for receiving and amplifying an audio signal.

11. An assembly comprising a board and the component as claimed in claim 10, which is electrically connected to the board via the solder balls.

12. A stress buffered semiconductor component, comprising:
    an electric circuit comprising a plurality of devices defined in a semiconductor substrate and an interconnection structure defined in one or more metal layers on the semiconductor substrate and protected by a passivation layer on top of the upper of the one or more metal layers, which passivation layer partially exposes an I/O pad being electrically connected to the electric circuit;
    a stress buffering element adapted for absorbing stresses on the I/O pad;
    an underbump metallization, electrically connected to the stress buffering element;
    characterized in that a roughness of an interface between the stress buffering element and the passivation layer is lower than a roughness of an interface between the upper metal layer and the passivation layer and, wherein the passivation layer includes a planarization layer for lowering the roughness of the interface between the stress buffering element and the passivation layer.

13. A component of claim 1, wherein the interconnect structure includes a dielectric layer of a low-K material.

14. A stress buffered semiconductor component, comprising:
    an electric circuit comprising a plurality of devices defined in a semiconductor substrate and an interconnection structure defined in one or more metal layers on the semiconductor substrate and protected by a passivation layer on top of the upper of the one or more metal layers, which passivation layer partially exposes an I/O pad being electrically connected to the electric circuit, the passivation layer including a first portion defined on top of an element in the upper one of the one or more metal layers and includes a second portion adjacent to the element;
    a stress buffering element adapted for absorbing stresses on the I/O pad;
    an underbump metallization, electrically connected to the stress buffering element; and
    characterized in that an upper surface of the first and second portions forming an angle that is less than 50 degrees, and a roughness of an interface between the stress buffering element and the passivation layer is lower than a roughness of an interface between the upper metal layer and the passivation layer.

* * * * *